United States Patent [19]
Durand

[11] Patent Number: 5,914,466
[45] Date of Patent: Jun. 22, 1999

[54] PHOTOREFLECTIVE ELEVATOR CALL BUTTON

[75] Inventor: Christophe Durand, Cernoy en Berry, France

[73] Assignee: Otis Elevator Company, Farmington, Conn.

[21] Appl. No.: 09/001,947

[22] Filed: Dec. 31, 1997

[51] Int. Cl.⁶ ............................................. B66B 1/34
[52] U.S. Cl. ........................................ 187/395; 187/391
[58] Field of Search ................................. 187/395, 391

[56] References Cited

U.S. PATENT DOCUMENTS

| | | | |
|---|---|---|---|
| 4,303,856 | 12/1981 | Serras-Paulet | 250/299 |
| 4,716,992 | 1/1988 | Kunii | 187/395 |
| 5,272,383 | 12/1993 | Umemura et al. | 307/112 |
| 5,679,933 | 10/1997 | Weber et al. | 187/395 |

Primary Examiner—Robert E. Nappi

[57] ABSTRACT

An elevator call button senses the position of a push button by means of a photoreflective sensor, thereby eliminating the need for a mechanical switch.

2 Claims, 2 Drawing Sheets

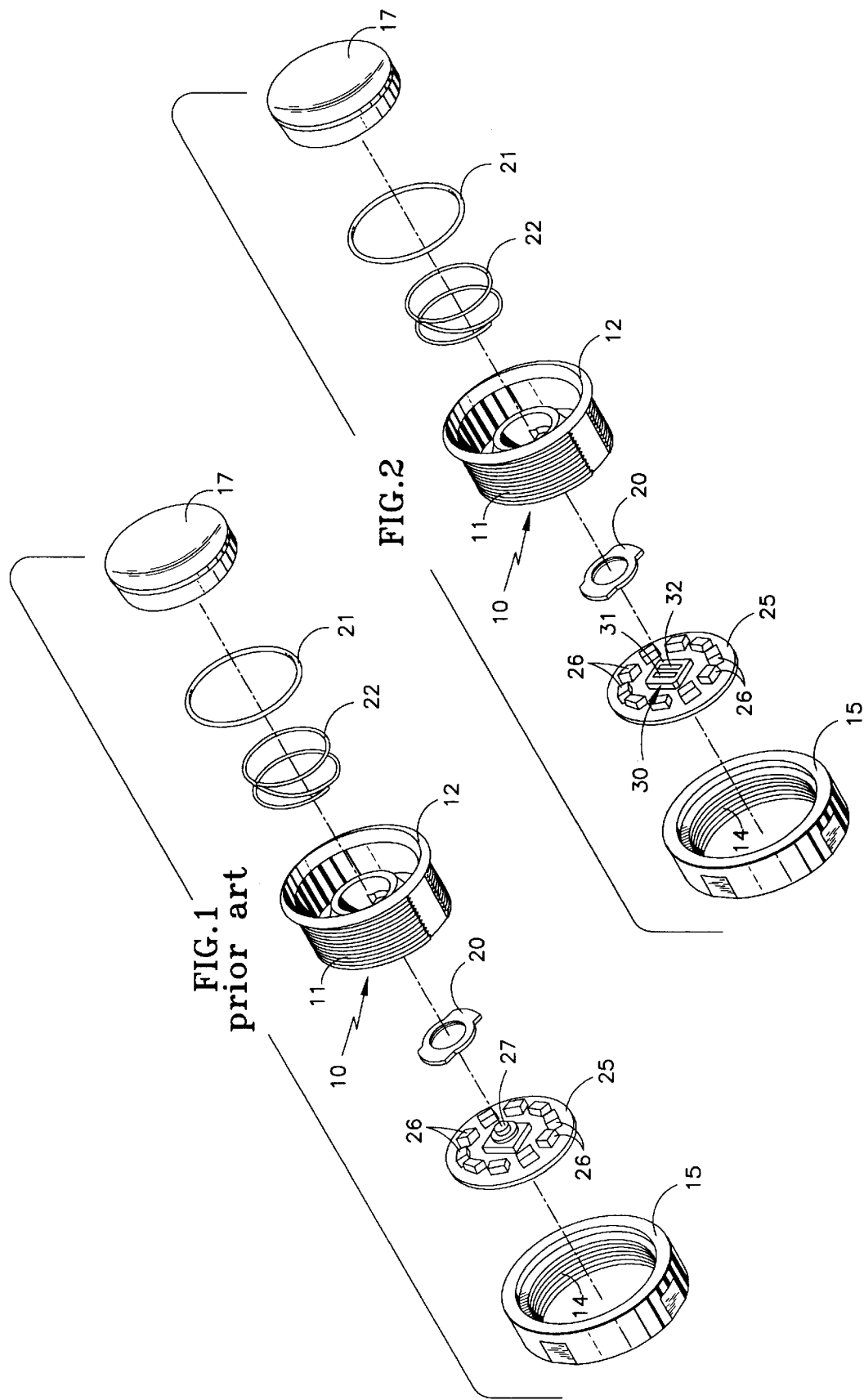

PHOTOREFLECTIVE ELEVATOR CALL BUTTON

TECHNICAL FIELD

This invention relates to use of a photoreflective sensor for detecting operation of an elevator call button.

BACKGROUND ART

Most elevator call buttons utilize a microswitch for detecting the operation of the button to place a call for an elevator stop. Mechanical call buttons of this type have a life on the order of a million cycles, which corresponds to an average service life of 10 years for non-lobby floors and three years for lobby floors. In addition, the low currents typically utilized in such switches makes the use of a gold contact necessary. In contrast, the plunger and spring portion of such switches can serve in excess of three million cycles and the light emitting diodes used to provide button illumination to indicate recognition of the call can serve 430,000 hours, giving a useful button life (except for the switch) on the order of 20 years.

DISCLOSURE OF INVENTION

Objects of the invention include the provision of an elevator call button which does not employ a mechanical switch, which is cost effective, which can be made to occupy the same space or less than that occupied by a typical mechanical call button, and that can be retrofitted into currently-used call button assemblies which presently employ a mechanical switch.

According to the present invention, an elevator call button uses a photoreflective sensor in place of a mechanical switch. According to the invention further, the existing switch plunger is utilized as a reflective surface for providing the optical reflection necessary for distinctive recognition of the operation of the call button. In further accord with the invention, circuitry is provided so as to permit utilizing light reflections when the button is not operated to result in conventional low voltage or no voltage output of the button assembly, whereas blockage of the light when the button is actuated results in the typical moderate output voltage (such as about five volts DC) to indicate operation of the call button.

The invention can be utilized in a call button which is very cost effective to produce, and, because of its service life of many tens of years without mechanical failure of any sort, is extremely cost effective when maintenance and replacement are considered. The invention leads the way for future improvements of elevator call buttons.

Other objects, features and advantages of the present invention will become more apparent in the light of the following detailed description of exemplary embodiments thereof, as illustrated in the accompanying drawing.

BRIEF DESCRIPTION OF THE DRAWINGS

FIG. 1 is an exploded perspective view of an elevator call button employing a mechanical switch known to the prior art.

FIG. 2 is an exploded perspective view of a call button like that of FIG. 1 but employing a photoreflective sensor of the invention in place of the mechanical switch.

BEST MODE FOR CARRYING OUT THE INVENTION

Figure 3:
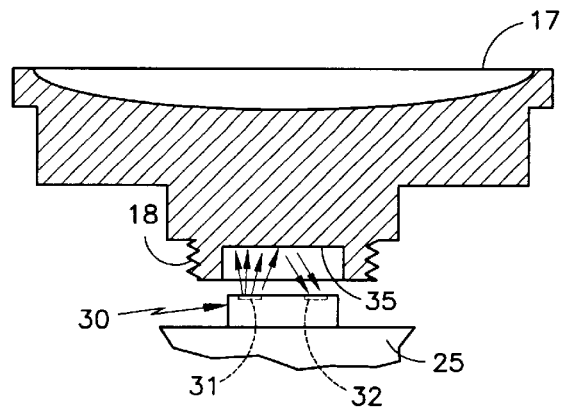
FIG. 3 is a sectioned, side elevation view of a push button working with the photoreflective sensor of the invention.

Referring to FIG. 1, an elevator call button known to the prior art comprises a main assembly 10 having threads 11 thereon and a lip 12 which will engage the user side of a panel (such as in a hallway or an elevator cab) as the threads 11 pass through a hole in the panel and are received by complementary threads 14 in a retaining ring 15. That is, a panel through which the main assembly passes is captured between the lip 12 and the retaining ring 15. A push button 17 has threads 18 on the inner side thereof (not shown in FIG. 1, but illustrated in FIG. 3) which are engaged by a nut 20 so as to retain the button 17 in position on the main assembly 10. A resilient seal 21 keeps dirt from entering the assembly. A coil compression spring 22 is captured between the push button 17 and the main assembly 10, and urges the push button outwardly toward the user except when the button is pressed. A circuit board 25 has a plurality of light emitting diodes 26 (LEDs) disposed thereon as well as a microswitch 27. The main assembly 10 is translucent, so that when the LEDs 26 are energized, indicating that a call request has been registered, light from the LEDs 26 travels through the main assembly 10 to illuminate the lip 12 in a known fashion.

In accordance with the invention as illustrated in FIG. 2, a photoreflective sensor 30 replaces the microswitch 27. The photoreflective sensor 30 has an emitter 31 and a detector 32.

Referring to FIG. 3, when the push button 17 is in the non-depressed position as shown, the infrared beam transmitted by the emitter 31 (upwardly directed arrows in FIG. 3) is reflected in part by the back surface 35 of the push button 17 toward the detector 32 (downwardly directed arrows in FIG. 3). On the other hand, when the button is depressed by a user, the surface 35 is closer to the photoreflective sensor 30, so that substantially no infrared radiation reaches the detector 32.

Figure 4:
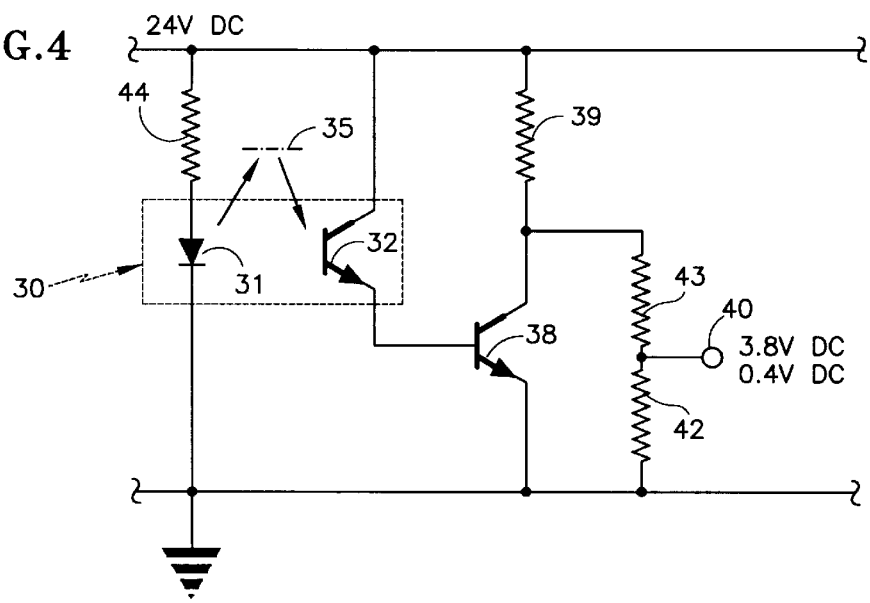
FIG. 4 is a schematic diagram of a first embodiment of the invention.

In FIG. 4, when the button 17 is not depressed, infrared radiation reaches the detector 32 so that it conducts heavily, causing a transistor 38 to saturate, dropping over 23 volts across a resistor 39, so that the output 40 is at about 0.4 volts DC. But when the button 17 is pressed so that there is little or no infrared radiation reflected to the detector 32, the detector 32 is blocked and transistor 38 is cut off, so that voltage division between resistors 42, 43 and 39 results in 3.8 volts DC at the output 40. A resistor 44 limits the current through the emitter. The resistors 39, 42 and 44 may be 4.7K ohms, and the resistor 43 may be 20K ohms. The transistor 38 may be a BC848. The photoreflective sensor 30 may be a Sharp T5589.

Figure 5:
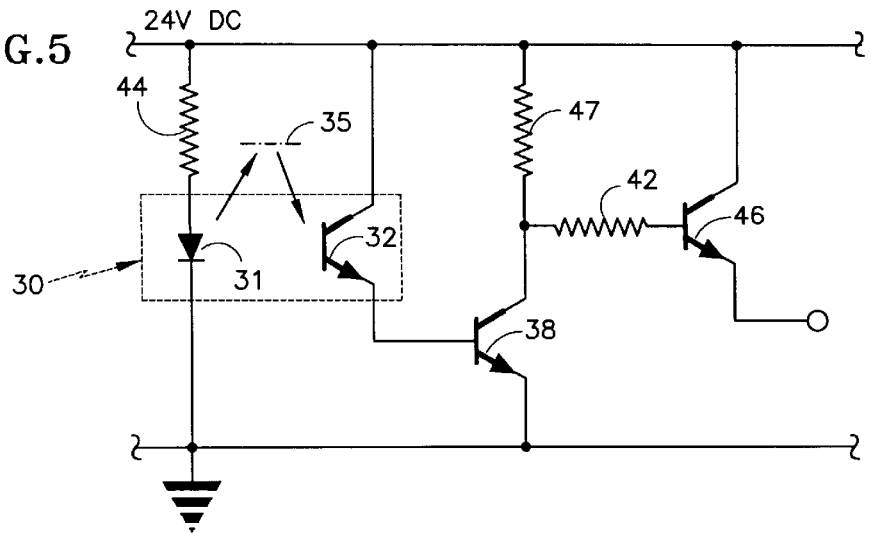
FIG. 5 is a schematic diagram of a second embodiment of the invention.

The embodiment of FIG. 5 operates similarly, but employs an additional transistor 46 and one less resistor. The transistor 46 may also be a BC848, while a resistor 47 is 15K ohms. The circuit of FIG. 5 draws only 6.5 milliamps in steady state with the button not depressed, while the steady state current for the circuit of FIG. 4 is 10.6 milliamps. The circuit elements of FIGS. 4 and 5 may be mounted on the circuit board 25 along with the photoreflective sensor 30.

The invention will provide good service for a long period of time since it will have fewer than 1.6% of the photoreflective sensors fail after ten years of continuous use.

Thus, although the invention has been shown and described with respect to exemplary embodiments thereof, it should be understood by those skilled in the art that the foregoing and various other changes, omissions and additions may be made therein and thereto, without departing from the spirit and scope of the invention.

I claim:

1. An elevator call button, comprising:

a push button having an outer contact surface adapted to be pressed by a user in order to register an elevator call, and having a reflective surface opposite said contact surface;

a photoreflective sensor having an emitter and a detector, said emitter and said detector being relatively disposed so that no radiation reaches said detector directly from said emitter, said photoreflective sensor mounted adjacent to said reflective surface;

means resiliently urging said push button to a non-operative rest position in which said reflective surface is a given distance from said photoreflective sensor at which distance significant radiation from said emitter is received by said detector;

said push button being moveable by a user to an operable position at which said surface is significantly closer to said photoreflective sensor than said given distance, at which position insufficient radiation is received at said detector so that current flow through said detector is blocked; and means responsive to the absence of current through said detector for supplying a signal indicating that a user has pressed said push button to register an elevator call.

2. An elevator call button, comprising:

a push button having an outer contact surface adapted to be pressed by a user in order to register an elevator call, and having a reflective surface opposite said contact surface;

a photoreflective sensor having an emitter and a detector, said emitter and said detector being relatively disposed so that no radiation reaches said detector directly from said emitter, said photoreflective sensor mounted adjacent to said reflective surface;

means resiliently urging said push button to a non-operative rest position in which said reflective surface is a given distance from said photoreflective sensor and said detector has a first response as a function of radiation reflected by said reflective surface from said emitter;

said push button being moveable by a user to an operable position at which said reflective surface is significantly closer to said photoreflective sensor than said given distance, at which position said detector has a second response as a function of radiation reflected by said reflective surface from said emitter which is different than said first response; and means responsive to said second response of said detector for supplying a signal indicating that a user has pressed said push button to register an elevator call.

* * * * *